United States Patent
Karhade et al.

(10) Patent No.: US 11,735,495 B2
(45) Date of Patent: Aug. 22, 2023

(54) ACTIVE PACKAGE COOLING STRUCTURES USING MOLDED SUBSTRATE PACKAGING TECHNOLOGY

(71) Applicant: Intel Corporation, Santa Clara, CA (US)

(72) Inventors: Omkar Karhade, Chandler, AZ (US); Mitul Modi, Phoenix, AZ (US); Edvin Cetegen, Chandler, AZ (US); Aastha Uppal, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1029 days.

(21) Appl. No.: 16/287,653

(22) Filed: Feb. 27, 2019

(65) Prior Publication Data
US 2020/0273775 A1   Aug. 27, 2020

(51) Int. Cl.
*H01L 23/46*   (2006.01)
*F28D 15/02*   (2006.01)
*H01L 21/48*   (2006.01)
*H01L 23/427*  (2006.01)

(52) U.S. Cl.
CPC ............. *H01L 23/46* (2013.01); *F28D 15/02* (2013.01); *H01L 21/4882* (2013.01); *H01L 23/427* (2013.01)

(58) Field of Classification Search
None
See application file for complete search history.

(56) References Cited

U.S. PATENT DOCUMENTS

| | | | | |
|---|---|---|---|---|
| 4,631,636 | A * | 12/1986 | Andrews | H05K 7/02 361/689 |
| 4,758,926 | A * | 7/1988 | Herrell | H01L 23/473 257/713 |
| 5,325,265 | A * | 6/1994 | Turlik | H01L 23/3736 257/E23.098 |
| 6,198,164 | B1 * | 3/2001 | Choi | H01L 25/50 257/730 |
| 8,617,927 | B1 * | 12/2013 | Margomenos | H01L 24/19 257/713 |
| 8,860,212 | B1 * | 10/2014 | Foong | H01L 23/3675 257/714 |
| 9,220,183 | B1 * | 12/2015 | Buvid | H01L 25/0657 |
| 9,646,924 | B2 * | 5/2017 | Sakaguchi | H01L 23/49827 |
| 11,521,914 | B2 * | 12/2022 | Wan | H01L 23/473 |
| 2006/0022334 | A1 * | 2/2006 | Myers | H01L 29/0657 257/E29.022 |
| 2006/0108097 | A1 * | 5/2006 | Hodes | F28F 3/12 257/E23.098 |

(Continued)

FOREIGN PATENT DOCUMENTS

WO   WO-2009040366 A1 *  4/2009   ......... H01L 23/467

*Primary Examiner* — Scott B Geyer
(74) *Attorney, Agent, or Firm* — Essential Patents Group, LLP

(57) ABSTRACT

Package assemblies with a molded substrate comprising fluid conduits. The fluid conduits may be operable for conveying a fluid (e.g., liquid and/or vapor) through some portion of the package substrate structure. Fluid conduits may be at least partially defined by an interconnect trace comprising a metal. The fluid conveyance may improve thermal management of the package assembly, for example removing heat dissipated by one or more integrated circuits (ICs) of the package assembly.

14 Claims, 13 Drawing Sheets

(56) References Cited

U.S. PATENT DOCUMENTS

| | | | | |
|---|---|---|---|---|
| 2006/0285300 | A1* | 12/2006 | Brandenburg | H01L 23/473 361/720 |
| 2007/0177352 | A1* | 8/2007 | Monfarad | H01L 23/473 257/E23.098 |
| 2008/0224303 | A1* | 9/2008 | Funakoshi | H01L 23/473 257/E23.088 |
| 2008/0266787 | A1* | 10/2008 | Gosset | H01L 23/473 257/E21.573 |
| 2008/0315403 | A1* | 12/2008 | Andry | H01L 25/0657 257/713 |
| 2009/0057879 | A1* | 3/2009 | Garrou | H01L 23/481 257/713 |
| 2009/0305482 | A1* | 12/2009 | Winter | H01L 23/34 438/584 |
| 2010/0187683 | A1* | 7/2010 | Bakir | H01L 23/53276 257/713 |
| 2011/0002102 | A1* | 1/2011 | Brok | H01L 23/467 361/689 |
| 2011/0205708 | A1* | 8/2011 | Andry | H01L 23/3677 438/122 |
| 2012/0228779 | A1* | 9/2012 | King, Jr. | H01L 24/13 257/E21.507 |
| 2012/0309129 | A1* | 12/2012 | Chung | H01L 25/50 438/109 |
| 2013/0285234 | A1* | 10/2013 | Uhlemann | H01L 23/367 257/782 |
| 2014/0252585 | A1* | 9/2014 | Chen | H01L 23/473 257/692 |
| 2014/0362552 | A1* | 12/2014 | Murayama | H05K 1/0272 361/783 |
| 2014/0376189 | A1* | 12/2014 | Sakaguchi | H01L 23/473 174/252 |
| 2015/0179617 | A1* | 6/2015 | Lin | H01L 23/42 257/713 |
| 2016/0037680 | A1* | 2/2016 | Hou | H05K 7/20345 361/699 |
| 2016/0172278 | A1* | 6/2016 | Collin | H01L 21/4875 257/693 |
| 2016/0190038 | A1* | 6/2016 | Koyama | H05K 7/20927 165/80.4 |
| 2017/0133298 | A1* | 5/2017 | Gutala | H01L 23/467 |
| 2018/0090428 | A1* | 3/2018 | Bernstein | H01L 23/49827 |
| 2019/0252357 | A1* | 8/2019 | Uemura | H01L 24/73 |
| 2019/0385933 | A1* | 12/2019 | Eid | H01L 25/0655 |
| 2020/0098669 | A1* | 3/2020 | Elsherbini | H01L 23/5389 |
| 2020/0105643 | A1* | 4/2020 | Wan | H01L 23/3672 |
| 2020/0176355 | A1* | 6/2020 | May | H05K 7/20327 |
| 2020/0203256 | A1* | 6/2020 | Neal | H01L 23/49827 |
| 2020/0211927 | A1* | 7/2020 | Wan | H01L 21/4882 |
| 2020/0227340 | A1* | 7/2020 | Lu | H01L 23/473 |
| 2020/0273775 | A1* | 8/2020 | Karhade | H01L 23/13 |
| 2020/0273776 | A1* | 8/2020 | Xu | H01L 23/3157 |
| 2022/0059432 | A1* | 2/2022 | Iizuka | H01L 23/31 |

* cited by examiner

ACTIVE PACKAGE COOLING STRUCTURES USING MOLDED SUBSTRATE PACKAGING TECHNOLOGY

BACKGROUND

In electronics manufacturing, integrated circuit (IC) packaging is a stage of semiconductor device fabrication, in which an IC that has been fabricated on a die (or chip) comprising a semiconducting material is encapsulated in an "assembly" or "package" that can protect the IC from physical damage and support electrical contacts that connect the IC to a host circuit board or another package. In the IC industry, the process of fabricating a package is often referred to as packaging, or assembly.

Central processors, power management ICs, and RFIC packages continue to achieve higher power densities. A number of IC packaging technologies include a heat spreader, which is to convey heat from an IC die to an external heat sink. Such passive cooling may however become inadequate in the near future, and active cooling technologies may be needed. However, active cooling through an IC package remains challenging, for example due to a variety of manufacturing difficulties associated with a given packaging technology. Package technologies that can accommodate active cooling at a minimal incremental cost may prove commercially advantageous, enabling longer IC assembly lifetimes in more extreme field environments, and/or higher IC device power densities, for example.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION OF EXEMPLARY EMBODIMENTS

Figure 1A:
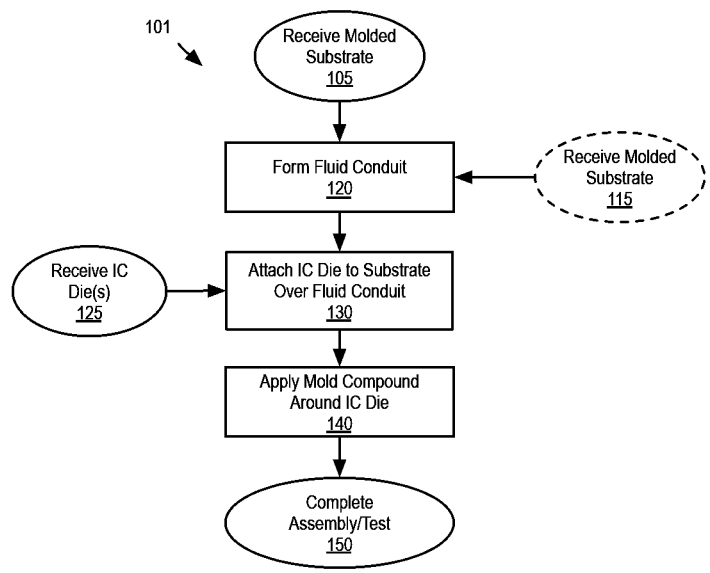
FIG. 1A illustrates a flow diagram of methods for fabricating an IC package assembly comprising a fluid conduit suitable for active cooling, in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Examples of active cooling structures that may be integrated within a substrate of a package assembly (e.g., single die, multi-die, 3D die stacks, etc.) are described herein. In accordance with some exemplary embodiments, a molded substrate integrates fluid conduits within a package substrate structure. These fluid conduits are operable for conveying a fluid (e.g., liquid) through some portion of the substrate. The fluid conveyance may improve thermal management of the package assembly, for example by removing heat dissipated by one or more integrated circuits (ICs) of the package assembly. Embodiments described herein may be particularly advantageous where cooling (active, or otherwise) on a top-side a package assembly is hindered. For example, when an interposer is over a top side of an IC die, or multiple die are stacked (e.g., memory IC over a logic IC), or the use of a heat spreader on the top side of the assembly is otherwise difficult, and, as a result, heat removal through the top side of a package assembly may be insufficient. Active cooling through a bottom side of an IC die may be achieved through use of the fluid conduit architectures described herein.

Molded substrate packaging technology comprises a preform substrate that includes an interconnect leadframe embedded within an electrical insulator (dielectric) material. During molded substrate manufacture, the dielectric material may be patterned and any number of metallization layers plated up from a sacrificial carrier, for example. Upon removal of the carrier, the mold preform can then be employed as a substrate for an IC package assembly. With structural benefits of the mold preform, the interconnect metallization may be of a significantly finer geometry (e.g., smaller trace dimensions) than a discrete leadframe. Electrical and thermal properties of a molded preform may also be superior to a discrete leadframe. Embodiments described further below integrate one or more fluid conduits into a substrate structure that comprises one or more molded preforms. Top side interconnects (e.g., top-side ball grid array, or TSBGA) on an uppermost molded preform may couple the substrate structure to one or more IC dies, while bottom side interconnects (e.g., bottom-side ball grid array, or BSBGA) may further couple a lowermost molded preform to a system-level interface (e.g., circuit board, etc.). The fluid conduits within the molded substrate structure may implement active cooling of the IC dies, for example with a fluid inlet and outlet coupled to opposite ends of a fluid conduit. A fluid, such as any suitable heat transfer liquid, may be conveyed through the fluid conduits, for example as part of a system-level coolant loop, to remove heat from the package assembly during operation of the IC dies.

In accordance with some embodiments, FIG. 1A illustrates a flow diagram of methods 101 for fabricating an IC package assembly comprising a fluid conduit suitable for active cooling, in accordance with some embodiments. Methods 101 begin at block 105 where a molded preform is received. The molded preform includes interconnect metallization within a dielectric mold material. The interconnect metallization may comprise any number of interconnect metallization (e.g., trace) levels. The dielectric mold material may have any suitable composition. At block 120, one or more fluid conduits are formed in the molded preform. In some embodiments, a fluid conduit comprises a cavity within the molded preform, for example within one or more interconnect metallization levels. In some alternative embodiments, methods 101 optionally further include block 115 where an additional molded preform is received and joined to the molded preform received at block 105. One or more fluid conduits may then be formed within features of the joint between two molded preforms.

Once the fluid conduit(s) are present within the substrate structure, methods 101 continue at block 125 where an IC die is received. The IC die may comprise one or more integrated circuits, and may for example by any of a microprocessor die, a memory die, a wireless/RF communication die, or a system-on-chip (SoC) die including one or more of microprocessor circuitry, memory circuitry, or RF transmitter/receiver circuitry, for example.

At block 130, the die received at block 125 is attached to the substrate structure. In exemplary embodiments, the IC die is attached, for example with solder features, to the substrate structure so that the IC die is located proximal (e.g., directly over) a fluid conduit of the substrate structure. Any number of IC dies may be attached at block 130, in either a 2D die layout, or a 3D die layout (i.e., die stack). Any die attachment process may be implemented at block 130, for example interconnect features on a surface of an IC die may be attached to a ball grid array (BGA) on a surface of the substrate structure.

With at least one IC die attached to the substrate structure, methods 101 may continue according to any compatible packaging assembly process. In the illustrated example, methods 101 continue at block 140 where a mold compound is applied around the IC die. Any suitable mold material may be applied at block 140 to form any suitable overmold structure, for example encapsulating one or more IC dies within a package assembly. Methods 101 are then completed at block 150 where any compatible packaging assembly and/or electrical test process(es) may be performed upon the package assembly.

Following completion of methods 101, the package assembly may be affixed to a system-level component, such as, but not limited to, a printed circuit board (PCB), or other interface. The system-level component may be part of any electronic device (e.g., wireless handset device, notebook computer device, networked computer server, automobile, autonomous platform, etc.).

Figure 1B:
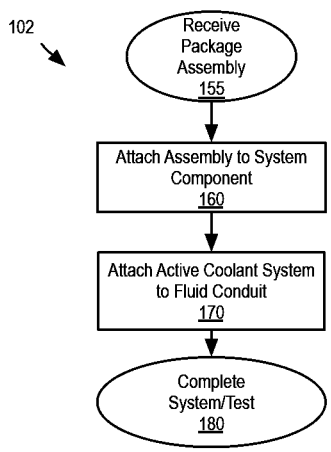
FIG. 1B illustrates a flow diagram of methods for coupling an IC package assembly comprising a fluid conduit suitable for active cooling to a system component, in accordance with some embodiments.

FIG. 1B illustrates methods 102 for integrating a package assembly with fluid conduits into a computer system or platform. Methods 102 begin at block 155 where a package assembly is received. The package assembly received at block 155 includes a substrate structure with fluid conduits, which may, for example, have been assembled according to methods 101. Methods 102 continue at block 160 where the package assembly is attached to interconnect features on a system board. Any technique known to be suitable for attaching a package assembly may be employed. In some embodiments, a substrate structure is attached to system-level interconnect features through a bottom side BGA (BSBGA) present on the substrate structure. At block 170, an active cooling recirculation loop of the system is coupled a fluid conduit present in the substrate structure. In one example, a system level fluid supply is coupled to an inlet end of a fluid conduit in the substrate structure. In a further example, a system level fluid return is coupled to an outlet end of the fluid conduit with a length of the fluid conduit coupling the inlet and outlet ends such that a heat transfer fluid that is to be conveyed through the system-level cooling loop passes through a length of the fluid conduit proximal to one or more IC dies in the package assembly. In some exemplary embodiments, coupling of the fluid conduit inlet and/or outlet ports comprises a reflow of one or more solder features joining the fluid conduit inlet and/or outlet ends to mating features of the system component (e.g., PCB).

Figure 1C:
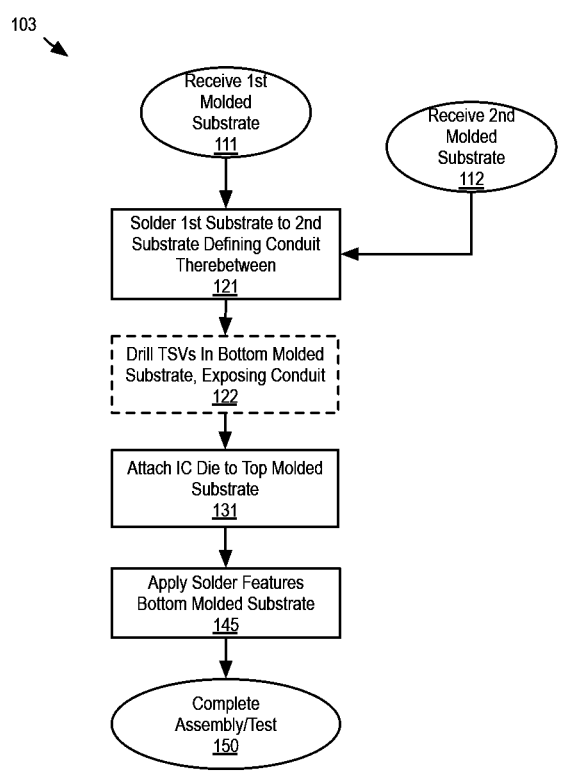
FIG. 1C illustrates a flow diagram of methods for fabricating an IC package assembly comprising a fluid conduit suitable for active cooling, in accordance with some embodiments of the methods shown in FIG. 1A.

FIG. 1C illustrates a flow diagram of methods 103 for fabricating an IC package assembly comprising a fluid conduit suitable for active cooling, in accordance with some embodiments. Methods 103 may be practiced as one implementation of the methods 101 that were illustrated in FIG. 1A. Methods 103 begin at block 111 where a first molded preform comprising a first interconnect structure embedded within a first mold material is received. A second molded preform comprising a second interconnect structure embedded within a second mold material is received at block 112. The two preforms are then assembled together at block 121 to form a substrate structure. In one example, interconnect features on one side of the mold preform received at block 111 are soldered to interconnect features on one side of the mold preform received at block 112 to form the substrate structure. A subset of the interconnect features joining the two molded preforms may define one or more walls of a lateral run (e.g., a "length") of a fluid conduit that is suitable for confining a fluid between the two molded preforms (i.e., within the substrate structure). In some embodiments, the fluid conduit comprises an opening at a perimeter edge of the substrate structure, for example where a heat transfer fluid supply and/or return may be coupled to and/or from the lateral conduit length. In some other embodiments, the fluid conduit lacks any openings at the edge of the substrate structure. For one such embodiment, methods 103 further include the formation of one or more through substrate vias (TSVs) that extend through at least the thickness of one of the molded preforms. The TSVs may be suitable for confining/conveying a fluid through one of the molded preforms, and the TSVs may intersect the lateral fluid conduit within the substrate structure (e.g., located between the two molded preforms). The TSVs may therefore function as vertical conduit runs and/or inlet/outlet ports of the substrate structure.

Methods 103 continue at block 131 where at least one IC die comprising at least one integrated circuit is attached to a first side of the substrate structure, and more specifically to interconnect features on a top surface of a top molded preform. At block 145, solder features (e.g., solder balls or bumps) are attached to a second side of the substrate structure, and more specifically to interconnect features on a bottom surface of a bottom molded preform. Methods 103 complete at block 150 where the package assembly is completed and/or tested. For example, an overmold process may be performed to encapsulate the IC die(s), etc. The package assembly is then ready to be attached to a system-level component by the bottom-side solder features.

A variety of package assembly structures, each having any number of fluid conduit features, may be fabricated according to the methods described above. Exemplary package assembly structures illustrating some illustrative fluid conduit features are described below. Although such package assembly structures may be fabricated according to one or more of the methods described above, similar structures may also be fabricated according to alternative methods.

Figure 2A:
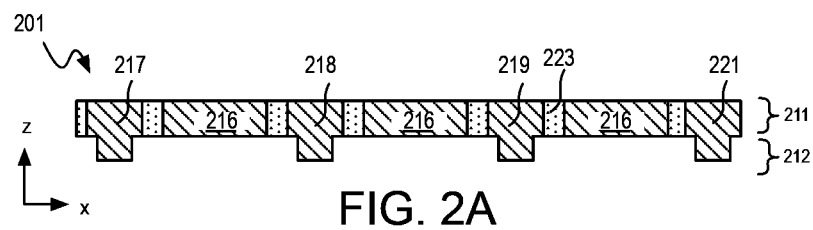
FIG. 2A-2D illustrate cross-sectional views of an IC package assembly including a multilayered molded substrate structure comprising a fluid conduit, in accordance with some embodiments.

FIG. 2A-2D illustrate cross-sectional views of an IC package assembly including a multilayered molded substrate structure comprising a fluid conduit at various stages of assembly, in accordance with some embodiments. FIG. 2A illustrates a sectional view of a molded preform 201. Molded preform 201 includes a metallization level 211 embedded within a dielectric material 223. Metallization level 211 includes any number of metallization features, such as traces 216. The metallization features may be of any material having suitable electrical conductivity, such as, but not limited to, copper, an alloy thereof, or another metal. Dielectric material 223 may be any suitable material, such as, but not limited to, mold material comprising an epoxy-based, or silicone-based matrix. Such matrix materials may be polymeric, with some examples of silicone-based polymers being polysiloxanes that further comprise silicon, oxygen, and carbon. In addition to the matrix material, dielectric material 223 may further comprise one or more fillers. In some embodiments, at least one of the fillers and matrix is carbonaceous (e.g., graphite, etc.).

Molded preform 201 further includes interconnect features in another metallization level 212. These interconnect features may be posts, or pillars, for example, that extend beyond a surface of dielectric material 223 in a manner that makes them suitable for solder contacts. Each interconnect feature within metallization level 212 may electrically couple to any number of features within metallization level 211. In the illustrated example, each of interconnect features 217, 218 and 219 interconnect metallization levels 211 and 212. Molded preform 201 may be formed according to any suitable techniques. In some embodiments, molded preform 201 is fabricated by forming a resist mask over a sacrificial carrier, plating metallization level 211 according to the resist mask, removing the resist mask, and molding dielectric material 223 around the plated metallization features. Dielectric material 223 may then be planarized (polished) to be co-planar with traces 216. Posts of metallization level 212 may then be plated upon exposed portions of metallization level 211, and the sacrificial carrier then removed to arrive at molded preform 201.

Figure 2B:
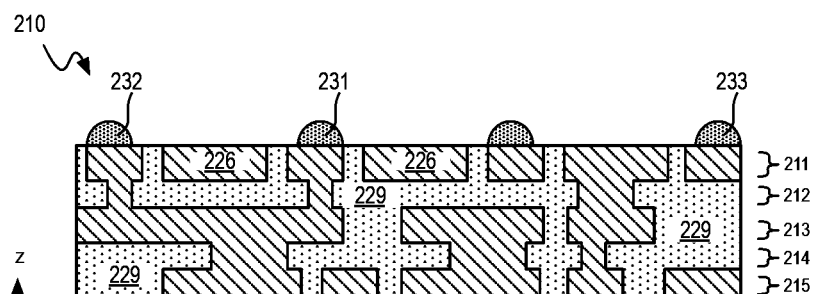

FIG. 2B illustrates a sectional view of a molded preform 210. Molded preform 210 also includes metallization levels embedded within a dielectric material 229. In the illustrated example, molded preform 210 includes metallization levels 211, 212, 213, 214, and 215, but more (or fewer) metallization levels may be present. Conductive interconnects 231, 232 and 233 are in contact with a surface of features in metallization level 211. Conductive interconnects 231-233 may be any known to be suitable for electrically coupling an IC die, such as, but not limited to, solder features (e.g., solder balls, solder bumps, microbumps, etc.). Dielectric material 229 may again be any suitable material, such as, but not limited to, mold material comprising an epoxy-based, or silicone-based matrix. In some embodiments dielectric material 229 has substantially the same composition as dielectric material 223 (FIG. 2A). Metallization levels 211-215 may comprise any suitable metal(s), such as, but not limited to copper.

Figure 2C:
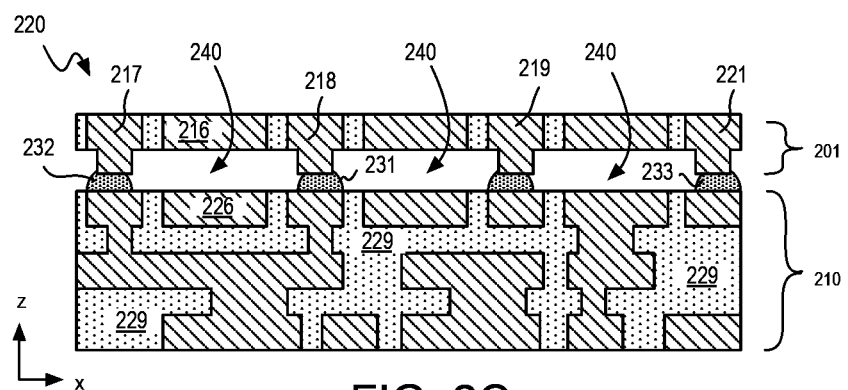

FIG. 2C illustrates a sectional view of a substrate structure 220 that includes molded preform 201 attached to molded preform 210. In this example, features in metallization level 212 of molded preform 201 are soldered to features in metallization level 211 of molded preform 210. As shown, interconnects 231-233 and/or interconnect features 217, 218, 219 and 221 stand-off molded preform 201 from an opposing nearest surface of molded preform 210. Fluid conduits 240 may reside within the standoff between molded preforms 201 and 210. Fluid conduits 240 may be separate channels, for example with interconnect feature 218 forming a boundary between two adjacent fluid conduits 240. Alternatively fluid conduits 240 may be portions of a larger conduit with interconnect feature 218 merely being a post around which a fluid may be present. At least one interconnect feature defines a sidewall of fluid conduit(s) 240 with opposing surfaces of molded preforms 201, 210 enclosing the bottom and top of the fluid conduit(s) 240, respectively. In the illustrated example, traces 216 and 226 at least partially define a top and bottom surface of fluid conduit(s) 240 with interconnect 217 defines a sidewall of fluid conduit(s) 240. As such, at least a portion of fluid conduit(s) 240 may comprise an interconnect metallization trace.

Figure 2D:
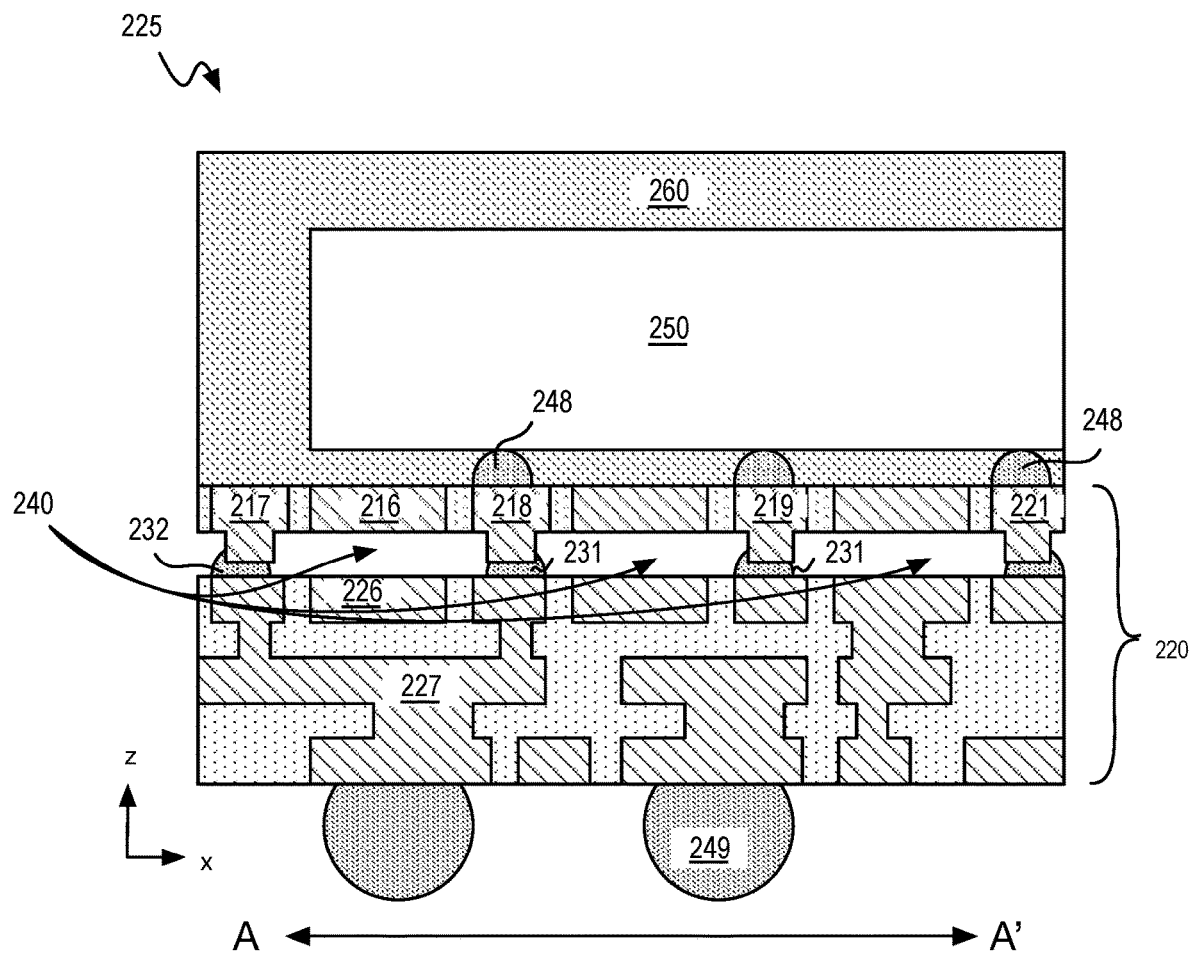

FIG. 2D illustrates a sectional view of an IC package assembly 225 that includes an IC die 250 attached to substrate structure 220. A package mold material 260 is over IC die 250. IC die 250 is coupled to a top surface of substrate structure 220 by solder interconnect features 248 (e.g., solder bumps, balls, etc.) with package mold material 260 therebetween. IC die 250 may be any die that includes one or more integrated circuits, such as, but not limited to, any of the examples described above. IC package assembly 225 further includes bottom-side solder features 249 in contact with a bottom metallization level of substrate structure 220. Solder features 249 may be solder balls or bumps, for example, suitable for coupling IC package assembly 225 to a system-level component, such as a PCB (not depicted).

As illustrated, no portion of IC die 250 is directly exposed to fluid conduit 240 with surfaces of IC die 250 instead separated from fluid conduit 240 by a portion of substrate structure 220. Interconnect features 218 and 219 electrically couple IC die 250, through a solder feature 231, to one or more additional metallization features 227 within substrate structure 220. The interconnect features 218 and 219 may therefore also be referred to herein as electrical interconnect structures. Interconnect feature 217 is not in electrical contact with IC die 250, and may instead function as a sidewall of fluid conduit(s) 240, for example with interconnect feature 217 and solder feature 232 together presenting a barrier suitable for confining a fluid within fluid conduit(s) 240. Interconnect feature 217 may also have other functions, for example as a thermal via, or may also make electrical contact to IC die 250 (e.g., to a ground plane, power plane, or signal I/O). In this example therefore, fluid conduit 240 is between metal traces above and below (e.g., metallization features 216, 226) and with a metal trace sidewall (e.g., interconnect feature 217).

Figure 2E:
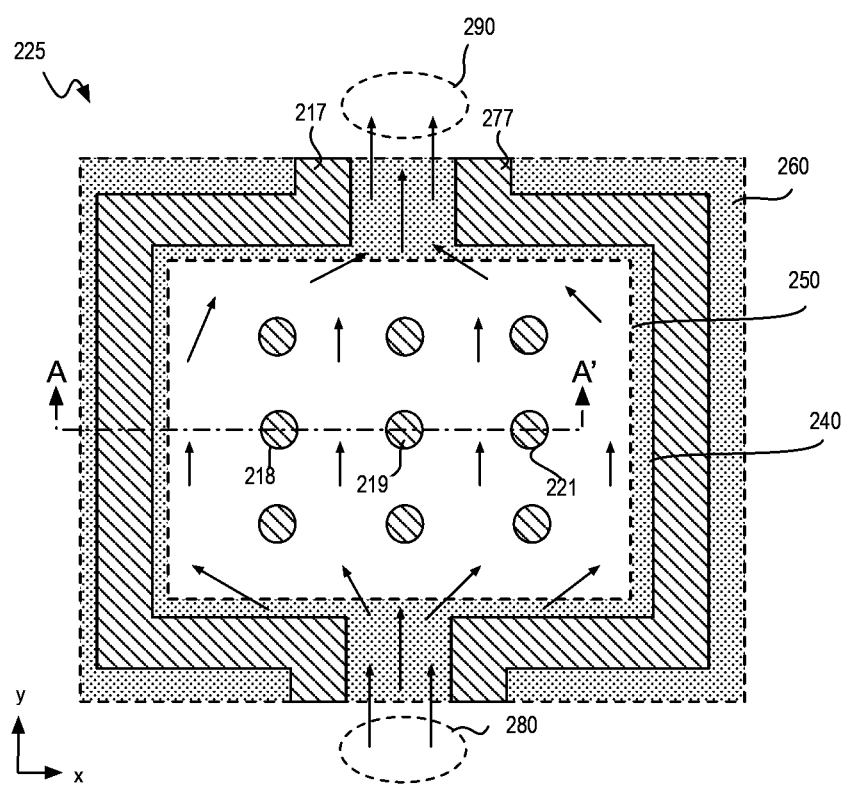
FIG. 2E illustrates a plan view of the IC package assembly illustrated in FIG. 2D, in accordance with some embodiments.

FIG. 2E illustrates a plan view of the IC package assembly 225, in accordance with some embodiments. The plan view shown is through a z-plane that intersects interconnect features 217, 218, 219 and 221. Dashed lines are out of the z-plane (e.g., below or above) and solid lines are on the z-plane. For reference, the A-A' line in FIG. 2E denotes the cross sectional plane illustrated in FIG. 2D. As shown in FIG. 2E, interconnect feature 217 is a metal trace that extends between opposite sidewalls of package assembly 225 with fluid conduit 240 extending a lateral length (e.g., y-axis) between a fluid inlet 280 and a fluid outlet 290. A second interconnect feature 277 is another trace presenting a continuous barrier to fluid flow along the length of fluid conduit 240, confining conduit 240 to a region of the IC package assembly 225 below IC die 250.

Fluid conduit 240 extends beyond the footprint of IC die 250, and has a length (e.g., y-dimension) that is longer than that of a sidewall of IC die 250. During operation of IC package assembly 225, a fluid may be conveyed through fluid conduit 240, entering at fluid inlet 280 and discharging from fluid outlet 290. An illustrative fluid flow pattern within the lateral run below IC die 250 is represented by straight arrows in FIG. 2E. In this example, IC die 250 (e.g., I/O signal ports) is electrically coupled to the substrate structure through interconnect features 218 and 219, which extend through, and/or are surrounded by, fluid conduit 240. Features 218 and 219 may be considered vias or traces, but at any rate have lengths (e.g., y-axis) smaller than that of features 217 and 277. With this fluid conduit architecture, it may be advantageous for fluid conduit 240 to convey a dielectric heat transfer fluid that is sufficiently electrically insulative such that multiple metallization features (e.g., interconnect features 218 and 219) directly immersed in the heat transfer fluid need not be electrically shorted. Exemplary dielectric heat transfer fluids include aliphatics, fluorocarbons and silicones.

Figure 3A:
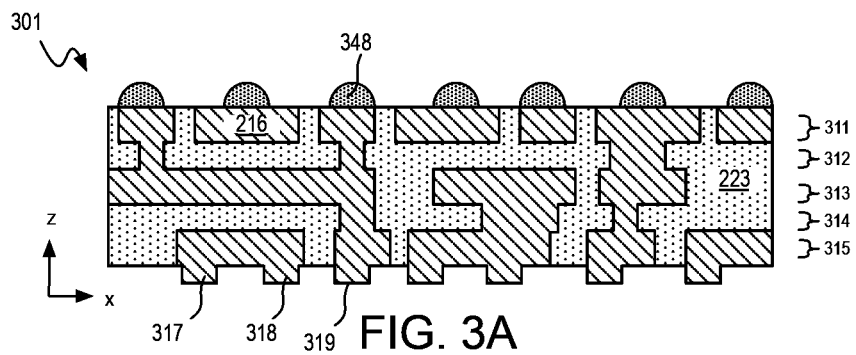
FIG. 3A-3D illustrate cross-sectional views of an IC package assembly including a multilayered molded substrate structure comprising a fluid conduit, in accordance with some embodiments.

In some embodiments, a fluid conduit is physically separated from one or more package substrate metallization features that further convey signals to/from an IC die. In accordance with some embodiments, a fluid conduit prevents fluid contact with any package metallization features that convey IC electrical signals through the package substrate. FIG. 3A-3D illustrate cross-sectional views of an IC package assembly evolving to include a multilayered molded substrate structure comprising a fluid conduit, in accordance with some embodiments. FIG. 3A illustrates a sectional view of a molded preform 301. Molded preform 301 includes metallization levels 311, 312, 313, 314 and 315 embedded within a dielectric material 223. Molded preform 301 further includes interconnect features 317, 318 and 319 (e.g., posts, or pillars) that extend beyond a surface of dielectric material 223 in a manner that makes them suitable for contacting a solder feature. In the illustrated example, only interconnect feature 319 is electrically coupled to a top-side solder feature (e.g., bump 348).

Figure 3B:
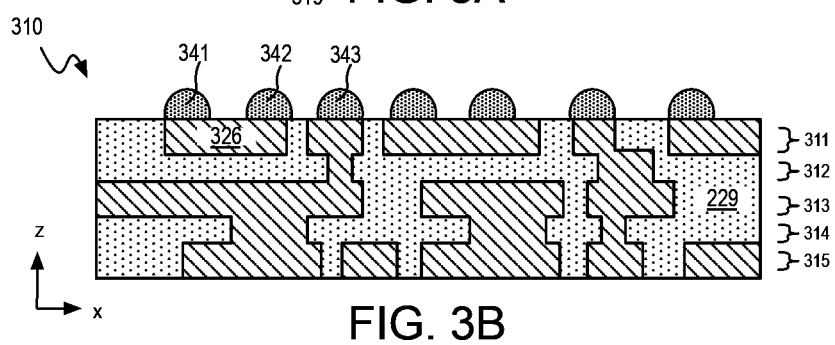

FIG. 3B illustrates a sectional view of a molded preform 310. Molded preform 310 also includes metallization levels 311-315 embedded within a dielectric material 229. Conductive interconnects (e.g., solder features 341, 342 and 343) are in contact with a surface of features in metallization level 311. Solder features 341-343 may be solder balls, solder bumps, microbumps, for example. Metallization level 315 includes features (e.g., pads) to receive conductive interconnects (e.g., solder features), and may alternatively include posts or pillars (e.g., like interconnect features 317, 318 and 319).

Figure 3C:
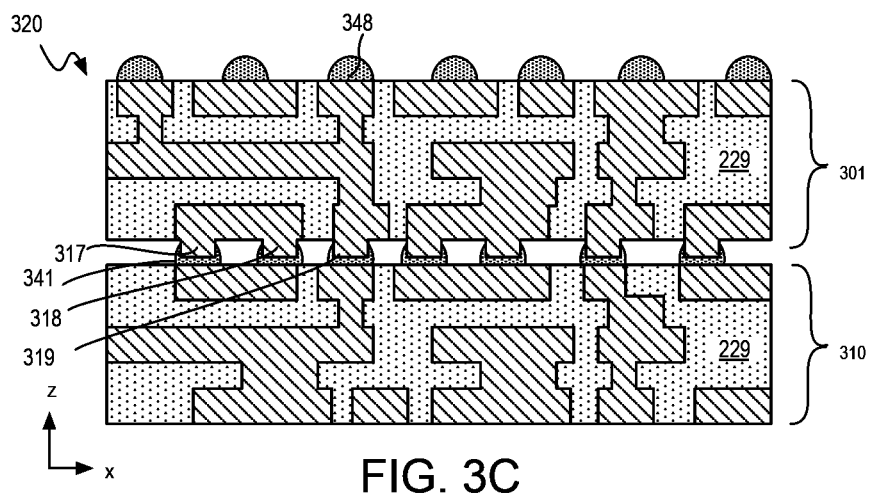

FIG. 3C illustrates a sectional view of a substrate structure 320 that includes molded preform 301 attached to molded preform 310. In this example, interconnect features (e.g., 317, 318 and 319) on a bottom side of molded preform 301 are connected to metallization level 311 (e.g., by solder features 341-343) on a top side of molded preform 310. As shown, solder features 341-343 and/or interconnect features 317-319 stand-off molded preform 301 from a nearest surface of molded preform 310. Fluid conduits may again reside within the standoff between molded preforms 301, but for exemplary embodiments where electrical pathways are isolated from the fluid conduit, the fluid conduit may be confined exclusively by non-electrical interconnect features.

Figure 3D:
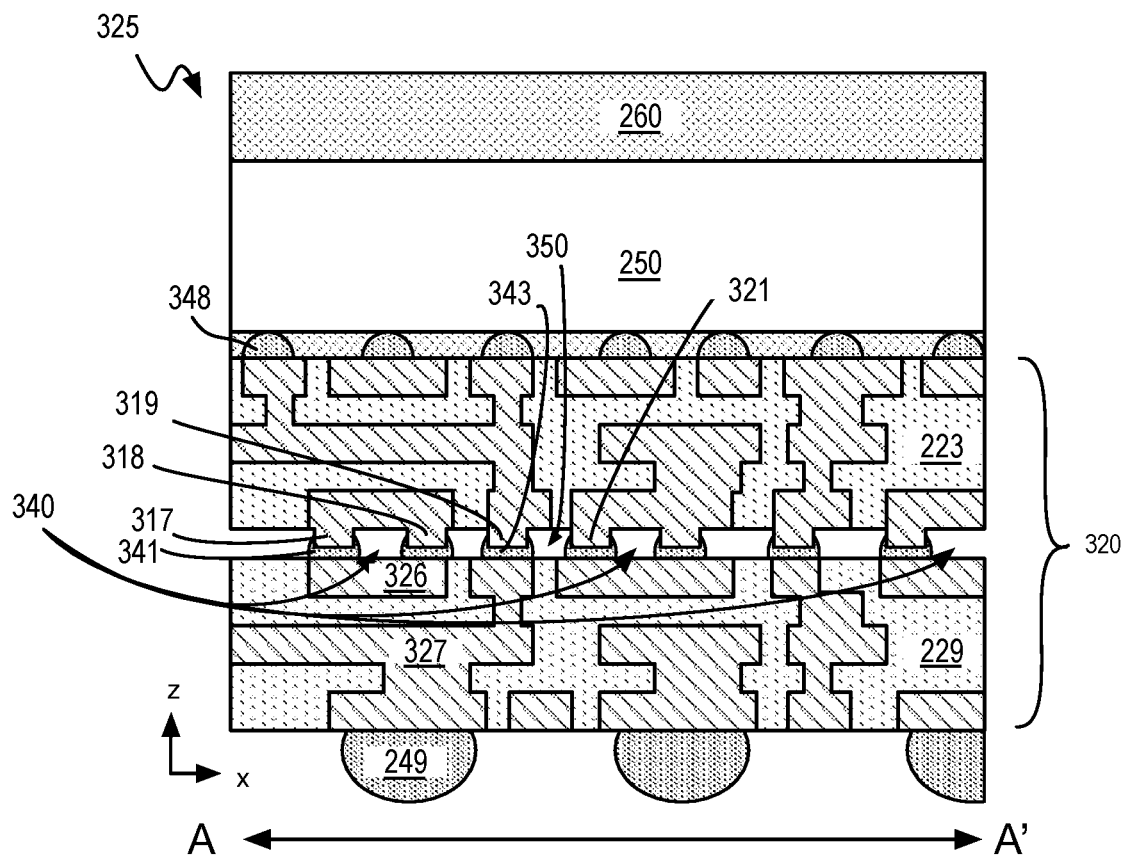

FIG. 3D illustrates a sectional view of an IC package assembly 325 that includes IC die 250 attached to substrate structure 320. Package mold material 260 is over IC die 250, and may also be present between die solder interconnect features 348 (e.g., solder bumps, balls, etc.). Alternatively, a separate underfill material may be between IC die 250 and substrate structure 320. IC package assembly 325 further includes bottom-side solder features 249 in contact with a metallization level within substrate structure 320. Interconnect feature 317 physically couples through solder feature 341, to one or more additional metallization features 326 within substrate structure 320. As further shown, interconnect feature 319 electrically couples IC die 250, through solder feature 343, to one or more additional metallization features 327 within substrate structure 320. In this example, interconnect features 317 and 318 each function as one sidewall of a fluid conduit 340 and do not further function as electrical connection(s) to IC die 250. Interconnect feature 317 and solder feature 341 together may present a barrier suitable for confining a fluid within a fluid conduit 340. Interconnect features 317-318 may also have other functions, for example as thermal vias, etc., and may even make electrical contact to IC die 250 (e.g., to a ground plane, power plane, or signal I/O). However, with interconnect features 317 and 318 defining fluid conduit 340, interconnect feature 319 is electrically isolated from any fluid that is to be conveyed through fluid conduit 340. Hence, a dry zone 350 may surround interconnect feature 319. In the illustrated example, dry zone 350 is between two fluid conduits 340 such that two adjacent fluid conduits 340 are separated from each other by two interconnect features 318 and 321 that are each a sidewall of one of one of the conduits 340.

Figure 3E:
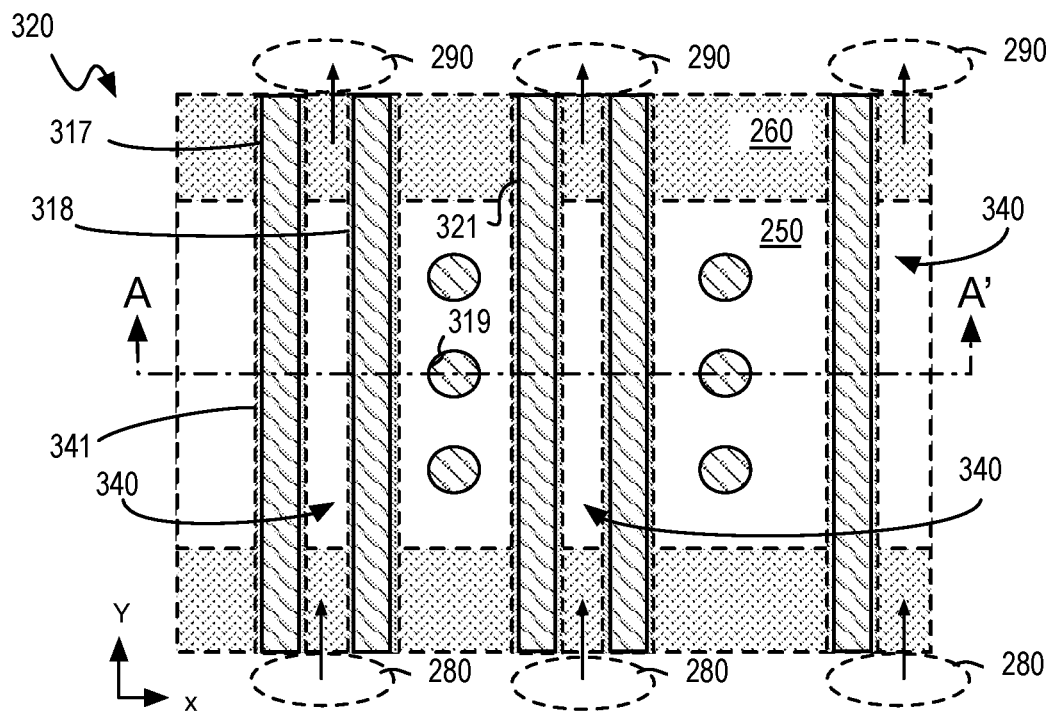
FIG. 3E illustrates a plan view of the IC package assembly illustrated in FIG. 3D, in accordance with some embodiments.

FIG. 3E illustrates a plan view of the IC package assembly 325, in accordance with some embodiments. The plan view shown is through a z-plane that intersects interconnect features 317, 318, 319 and 321. Dashed lines are out of the z-plane (e.g., below or above) and solid lines are on the z-plane. For reference, the A-A' line in FIG. 3E denotes the cross sectional plane illustrated in FIG. 3D. As visible in the plan view, interconnect features 317 and 318 are substantially parallel traces that define a longitudinal length of fluid conduit 340. Interconnect features 317 and 318 extend between opposite sidewalls of package assembly 325 with fluid conduit 340 having a lateral length (e.g., y-axis) between a fluid inlet 280 and a fluid outlet 290. Solder feature 341 is also illustrated to be continuous along the length of interconnect feature 317. Solder 341 and interconnect feature 317 may, for example, provide a continuous barrier to fluid flow along the length of a fluid conduit 340. A similar solder feature is continuous along the length of interconnect feature 318 to provide a second continuous barrier to fluid flow along the length of fluid conduit 340.

Fluid conduit 340 extends beyond the footprint of IC die 250, and has a length (e.g., y-dimension) that is longer than that of a sidewall of IC die 250. During operation of IC package assembly 325, a fluid may be conveyed through fluid conduit 340, entering at fluid inlet 280 and discharging from fluid outlet 290 and having some fluid flow pattern (e.g., represented by straight arrows in FIG. 3E) within the lateral run below IC die 250. In this example, IC die 250 (e.g., I/O signal ports) is electrically coupled to the substrate structure through interconnect feature(s) 319, with is isolated from fluid conduit 340. Feature(s) 319 may have any lateral dimensions. Another fluid conduit 340 is further isolated from interconnect feature(s) 316 by interconnect feature 321, that may be similarly attached to a solder feature. With this fluid conduit architecture, fluid conduit 340 may convey any heat transfer fluid, including those that are not considered to be dielectric fluids since metallization features electrically coupled to IC die 250 are not directly exposed to any heat transfer fluid.

Figure 4A:
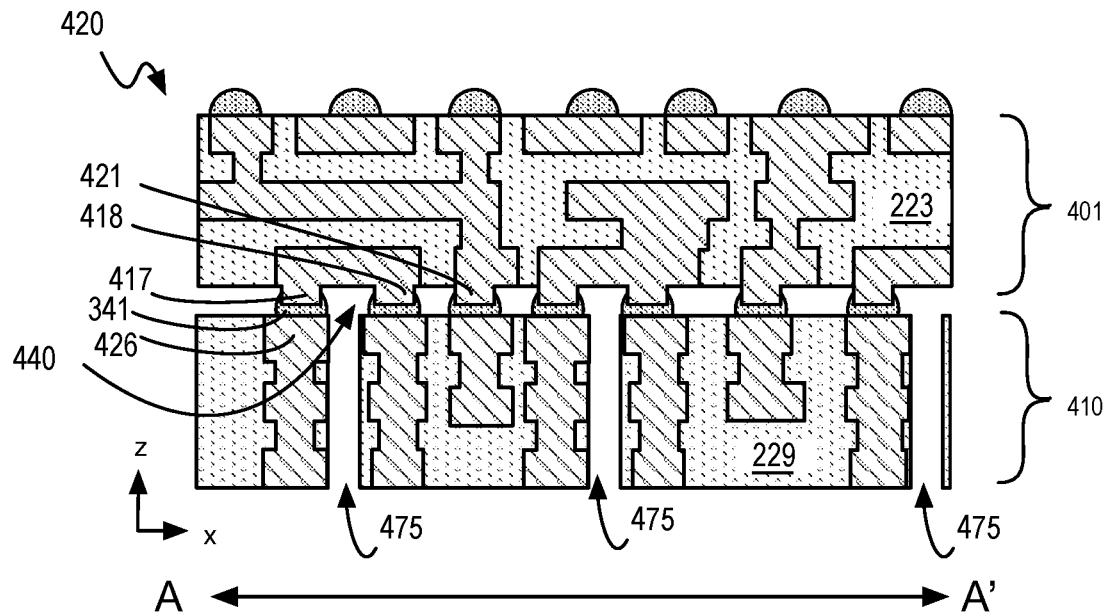
FIG. 4A-4B illustrate cross-sectional views of an IC package assembly including molded substrate structure comprising a fluid conduit TSV, in accordance with some embodiments.
Figure 4B:
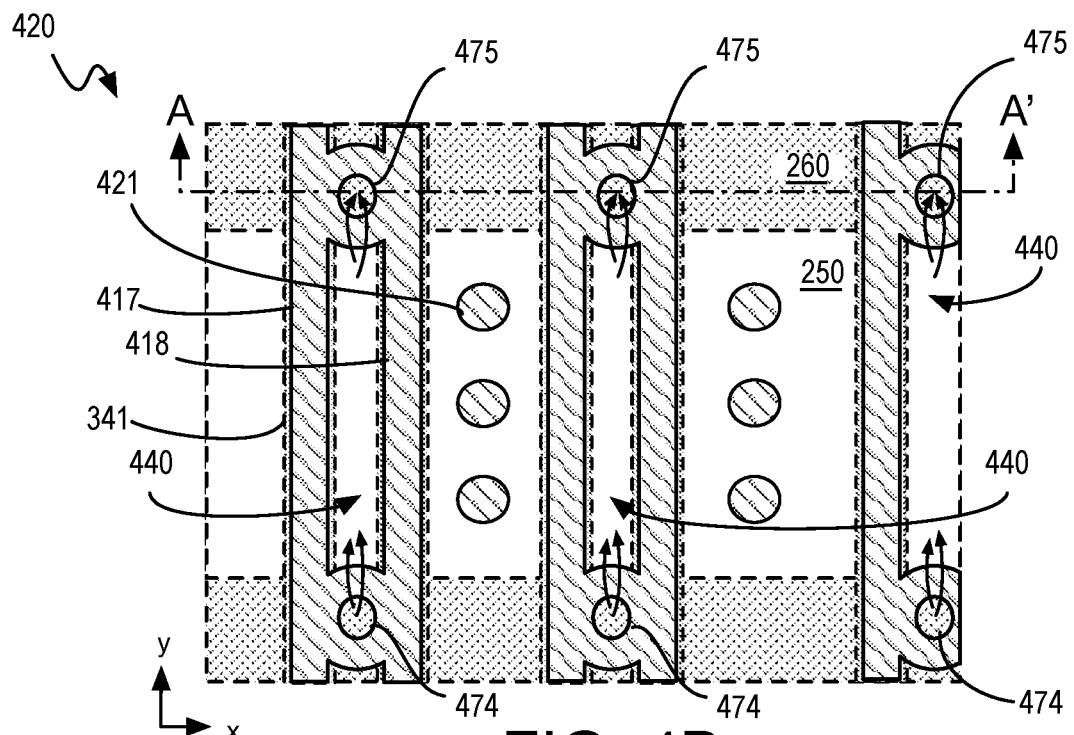

In some embodiments, a molded substrate structure includes a fluid conduit having a longitudinal length that extends through at least a partial thickness of the substrate structure. Hence, in addition to lateral runs over a substrate structure, a fluid conduit may also include vertical runs. With vertical runs, a fluid conduit need not have an inlet and/or outlet on edges of the substrate structure, for example. In some embodiments, a vertical conduit run comprises a through-substrate via (TSV). Such a fluid conduit TSV may include one or more metallization features of a molded preform as a conduit sidewall. Sidewalls of the TSV may also include mold material of a molded preform. FIG. 4A-4B illustrate cross-sectional views of an IC package assembly 420 including a molded substrate structure comprising a fluid conduit TSV, in accordance with some embodiments. As shown in FIG. 4A, an interconnect feature 417 of a molded preform 401 is attached by solder features 341 to a TSV metallization features 426 of a molded preform 410. Fluid conduit 440 is located between molded preforms 401 and 410, and comprise a TSV 475 that extends through the z-thickness of molded preform 410. Such a TSV may be drilled (e.g., laser or mechanical) through a preform, or may be the result of an iterative patterning process (e.g., with a sacrificial material that is removed selectively to mold material 229).

FIG. 4B illustrates a plan view of the IC package assembly 420, in accordance with some embodiments. The plan view shown is through a z-plane that intersects interconnect features 417, 418 and 421. Dashed lines are out of the z-plane (e.g., below or above) and solid lines are on the z-plane. For reference, the A-A' line in FIG. 3E denotes the cross sectional plane illustrated in FIG. 4A. As visible in the plan view, TSVs 475 are at opposite ends of a lateral run of fluid conduit(s) 440 with TSVs 475 intersecting a spacing or channel between interconnect features 417 and 418. Fluid conduits 440 may therefore have an inlet and/or outlet at a bottom surface of molded preform 410. For this embodiment also, electrical connections to an IC die (e.g., through interconnect features 421) are isolated from fluid conduits 340, but in the alternative may also be exposed to the fluid conduits.

In some embodiments, a fluid conduit is embedded within a molded preform. Such a fluid conduit may be completely sealed within the molded preform, or may include an inlet/outlet port. Embedded fluid conduits may not rely upon solder and/or interconnect features in the manner described above, but may otherwise share one or more structural features with the fluid conduits described above.

Figure 5:
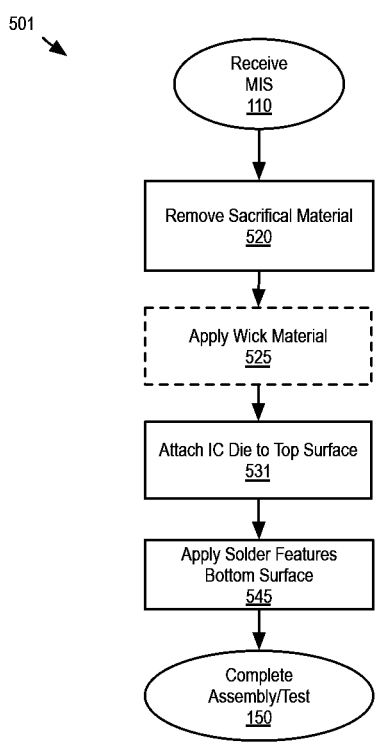
FIG. 5 illustrates a flow diagram of methods for assembling an IC assembly including a fluid conduit suitable for active cooling, in accordance with some embodiments.

FIG. 5 illustrates a flow diagram of methods 501 for assembling an IC assembly including a fluid conduit suitable for active cooling, in accordance with some embodiments. Methods 501 again begin at block 110 where a molded preform is received. The molded preform may have one or more of the attributes described elsewhere herein, and may further comprise a sacrificial material that is to be removed selectively to the interconnect metallization and/or mold material at block 520. Once a cavity is formed in the molded preform, the cavity may be filled with a heat transfer fluid and/or a variety of components to facilitate active cooling of an IC die. For example, the embedded cavity may be fitted with inlet and outlet ports that interface with a system-level cooling loop. As another example, a heat pipe device may be positioned (e.g., by pick-and-place) within the molded preform cavity as a closed-loop cooling system for an IC die that is to be subsequently attached to the molded preform. Such a heat pipe device may be integrated into the molded preform such that one or more metallization features of the molded preform that are exposed by the cavity may implement hot and/or cold sides of the heat pipe upon the addition of a heat transfer fluid to the cavity. Optionally, a porous "wick" material may also be applied to the cavity at block 525, for example. The cavity may then be sealed, for example during the package assembly process, and an IC die attached to (top) surface of the preform at block 531. At block 545, solder features may be applied to a bottom surface of the preform, and package assembly and/or test performed at block 150.

Figure 6A:
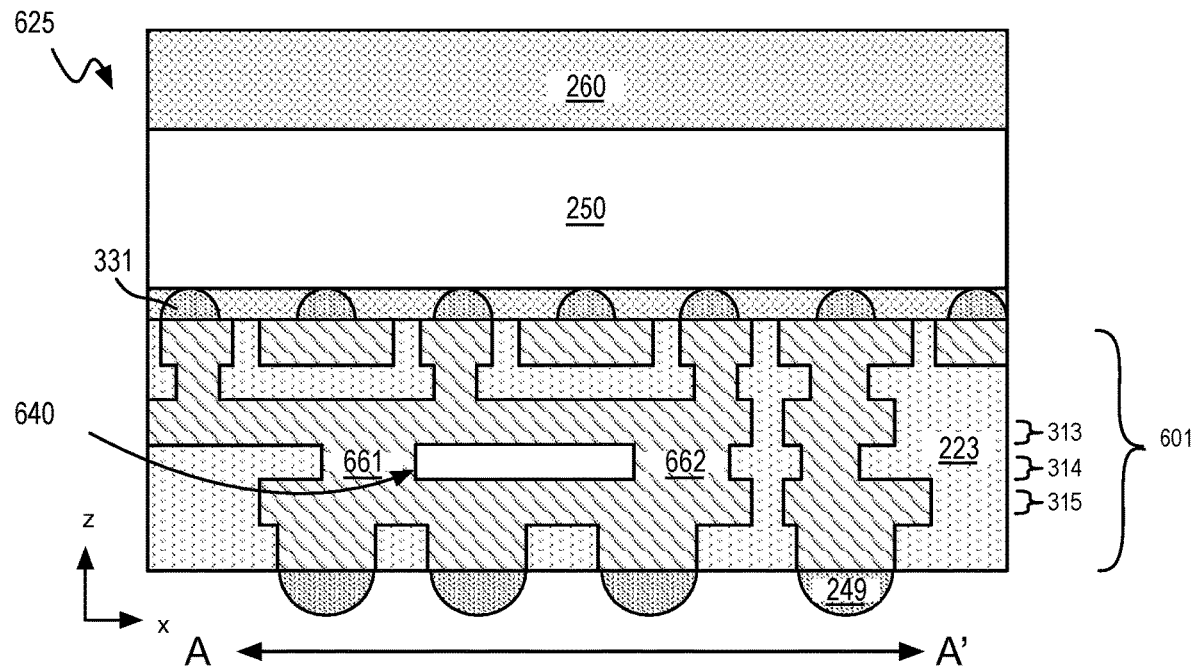
FIG. 6A illustrates a cross-sectional view of an IC package assembly including molded substrate structure comprising a fluid conduit, in accordance with some embodiments.

FIG. 6A illustrates a cross-sectional view of an IC package assembly 625 including molded substrate structure 601 comprising a fluid conduit 640, in accordance with some embodiments. As illustrated, fluid conduit 640 is embedded within substrate structure 601, for example with a bottom surface of the conduit comprising a first interconnect metallization level 315, and a top surface of the conduit comprising a second interconnect metallization level 313. Sidewalls of fluid conduit 640 comprise interconnect metallization features 661 and 662, of an intervening metallization level 314. IC package assembly 625 may be formed during package assembly (e.g., according to methods 501), or may be formed during the fabrication of a molded preform that is then utilized in subsequent package assembly.

Figure 6B:
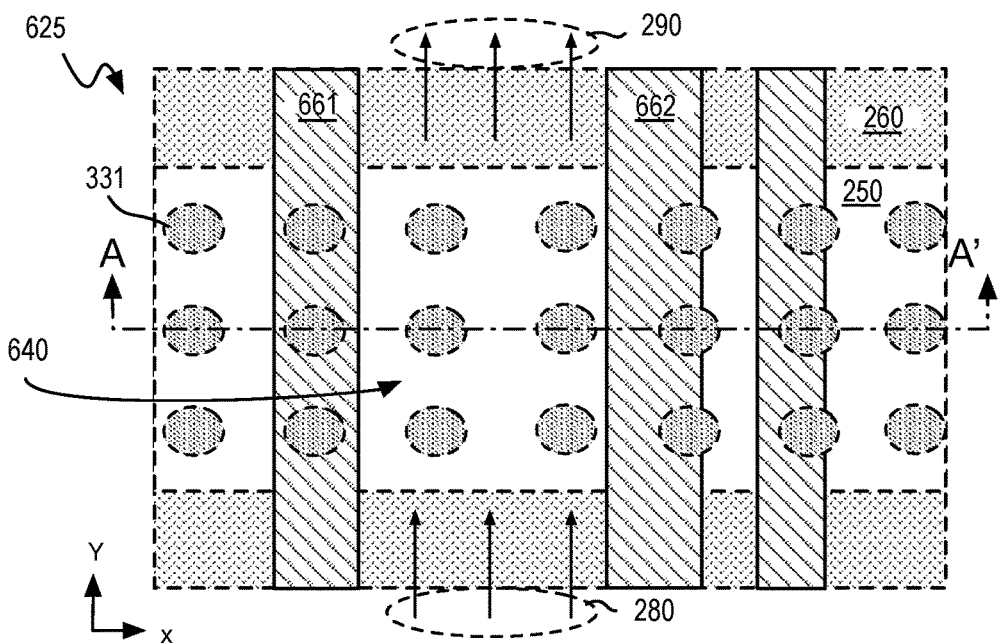
FIG. 6B illustrates a plan view of the IC package assembly illustrated in FIG. 6A, in accordance with some embodiments.

FIG. 6B illustrates a plan view of the IC package assembly 625, in accordance with some embodiments. The plan view shown is through a z-plane that intersects interconnect metallization features 661 and 662. Dashed lines are out of the z-plane (e.g., below or above) and solid lines are on the z-plane. For reference, the A-A' line in FIG. 6B denotes the cross sectional plane illustrated in FIG. 6A. As visible in the plan view, interconnect features 661 and 662 are substantially parallel traces that define a longitudinal length of fluid conduit 640. Interconnect features 661 and 662 extend between opposite sidewalls of package assembly 625 with fluid conduit 640 having a lateral length (e.g., y-axis) between a fluid inlet 280 and a fluid outlet 290. In contrast to fluid conduits described elsewhere herein, fluid conduit 640 does not incorporate a solder feature along the length of the conduit. Instead, sidewalls of fluid conduit 640 are defined only by interconnect metallization traces embedded within a single molded preform.

Fluid conduit 640 extends beyond the footprint of IC die 250, and has a length (e.g., y-dimension) that is longer than that of a sidewall of IC die 250. During operation of IC package assembly 625, a fluid may be conveyed through fluid conduit 640, entering at fluid inlet 280 and discharging from fluid outlet 290 with an illustrative fluid flow pattern within the lateral run below IC die 250 represented in FIG. 6B by straight arrows. In this example, IC die 250 is electrically coupled to the substrate structure through interconnect feature(s) 661 and 662, which also define fluid conduit 640. In some examples, interconnect features 661 and 662 maintain a single reference voltage for IC die 250 with no voltage potential then applied across a coolant fluid that may be contained within, and/or conveyed through, fluid conduit 640. Interconnect features 661 and 662 may be part of a ground plane of package assembly 625, may be electrically floating, or may be powered to a power rail level supplied to IC die 250, for example. In other embodiments, an embedded fluid conduit may be contained within metallization traces that are not electrically coupled to any signal, power, or ground port of an IC die.

As noted above in the context of methods 501, in addition to facilitating active cooling loops that are open to a coolant fluid supply/return external of an IC package assembly, fluid conduits in accordance with embodiments herein may also be suitable for closed loop cooling systems that are fully contained with a molded substrate and/or IC package assembly. A heat pipe device is one example of an active cooling system where no system-level fluid supply/return is needed. A heat pipe device implemented in an assembly process may be substantially as described above with hot and cold sides of the heat pipe device on two different molded preforms that are attached by interconnect features, such as a solder features. Alternatively, an embedded heat pipe device may be implemented in an assembly process where a sacrificial material is removed from a molded substrate during the assembly process and a heat pipe device installed or constructed. Upon removing a sacrificial material to form a fluid conduit for example, a portion of the fluid conduit exposed to an exterior surface (e.g., edge sidewall) of a package substrate structure may be plugged to isolate the fluid conduit. In still other embodiments, the heat pipe device may be formed upstream of assembly (e.g., during fabrication of a molded preform).

Figure 7A:
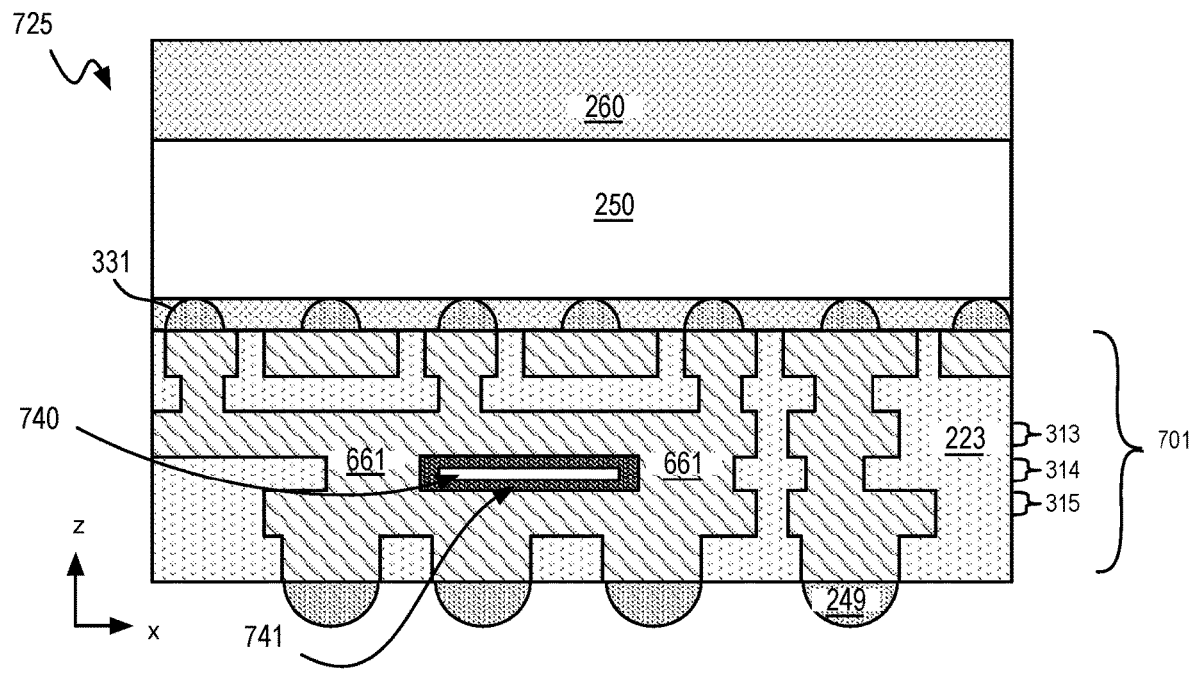
FIG. 7A illustrates a cross-sectional view of an IC package assembly including a molded substrate structure comprising a heat pipe, in accordance with some embodiments.
Figure 7B:
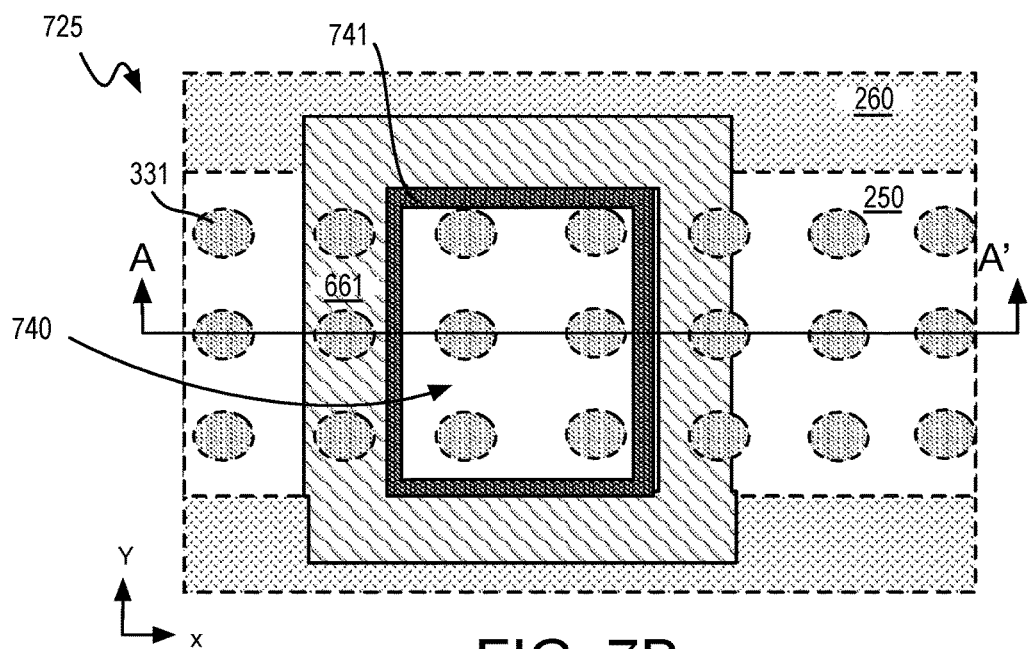
FIG. 7B illustrates a plan view of the IC package assembly illustrated in FIG. 7A, in accordance with some embodiments.

FIG. 7A illustrates a cross-sectional view of an IC package assembly 725 including a molded substrate structure 701 that further comprises a heat pipe device 740, in accordance with some embodiments. Heat pipe device 740 comprises a fluid conduit that is closed rather than the open conduit 640 (FIG. 6A-6B). FIG. 7B illustrates a plan view of the IC package assembly 725, in accordance with some embodiments. The plan view shown is through a z-plane that intersects interconnect metallization features 661 and 662. Dashed lines are out of the z-plane (e.g., below or above) and solid lines are on the z-plane. For reference, the A-A' line in FIG. 7B denotes the cross sectional plane illustrated in FIG. 7A. As visible in the plan view, a sidewall of heat pipe device 740 comprises a molded preform metallization feature 661 that forms a continuous perimeter about an interior region, or cavity, within which a heat transfer fluid is to be conveyed between hot and cold surfaces of the heat pipe device.

Heat pipe device 740 is a closed system that utilizes evaporative cooling to move heat from a heat source (e.g., from a hot side coupled to IC die 250) to a heat sink (e.g., to a cold side component coupled to solder features 249). Heat transfer of heat pipe device 740 operates on phase transition principle. For example, a fluid conduit may include a porous material 741 occupying a section of the conduit, and an open space or passageway within another section of the conduit. The conduit further includes a heat transfer fluid, more or less of which may be in liquid and/or vapor phase as a function of the temperature and/or physical location of the fluid within the heat pipe device. The liquid phase of the heat transfer fluid in contact with the hot side of the conduit may evaporate, thereby absorbing heat from the hot side. The resulting vapor phase of the heat transfer fluid may travel along the open passageway of the conduit towards the cold side. Once the vapor phase of the heat transfer fluid is at or near the cold side, the vapor may condense back to the liquid phase, thereby releasing latent heat at the cold side. The liquid phase of the heat transfer fluid is then transported back to the hot side through the porous material, for example, by capillary action. Thus, in heat pipe device 740, a change of phase of the heat transfer fluid between liquid and vapor aids in transfer of heat from the hot side (proximal to IC die 250) to the cold side (proximal to solder features 249), thereby cooling IC die 250.

Heat pipe device 740 is embedded within substrate structure 701, with a metallization trace (or other feature) of metallization level 313 functional as a hot-side surface and metallization trace (or other feature) of metallization level 315 functional as a cold-side surface. Sidewalls of heat pipe device 740 include material that can hermetically seal the fluid conduit. In the illustrated example, interconnect features 661, each comprising a metal (e.g., copper), further serve to seal the fluid conduit. Hence, the material employed as electrical interconnects of molded preform 701 are further employed to seal heat pipe device 740. Interconnect metallization may completely isolate heat pipe device 740 from mold material 223, for example.

Heat pipe device 740 may contain a heat transfer fluid (not depicted). The heat transfer fluid may be based on an application of the package assembly 725. For example, the selection of the heat transfer fluid may be based on an anticipated maximum temperature at the hot side, a desired amount of heat to be transferred, etc. Exemplary heat transfer fluids include those fluids described above as well as water, IPA, ethanol, methanol, and R1234ze). Porous material 741 may be any material known to be suitable for the application that is further suitable to the package assembly process and/or molded preform fabrication process. In some examples porous material 741 is a sol-gel material derived from a colloidal solution (sol) that acts as the precursor for an integrated network (or gel) of either discrete particles or network polymers.

Figure 8:
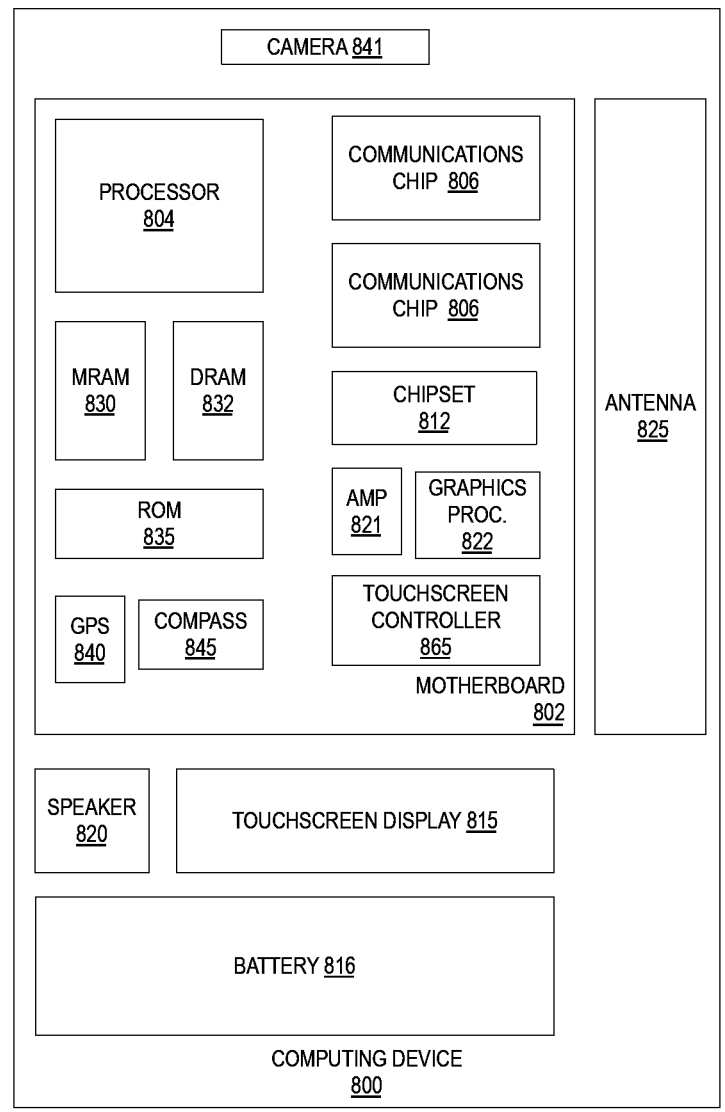
FIG. 8 is a functional block diagram of an electronic computing device, in accordance with some embodiments.

FIG. 8 is a functional block diagram of an electronic computing device 800, in accordance with an embodiment of the present invention. Device 800 further includes a motherboard 802 hosting a number of components, such as, but not limited to, a processor 804 (e.g., an applications processor). Processor 804 may be physically and/or electrically coupled to motherboard 802. In some examples, processor 804 includes an integrated circuit die packaged with active package cooling structures within a molded packaging substrate, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 806 may also be physically and/or electrically coupled to the motherboard 802. In further implementations, communication chips 806 may be part of processor 804. Depending on its applications, computing device 800 may include other components that may or may not be physically and electrically coupled to motherboard 802. These other components include, but are not limited to, volatile memory (e.g., DRAM 832), non-volatile memory (e.g., ROM 835), flash memory (e.g., NAND or NOR), magnetic memory (MRAM 830), a graphics processor 822, a digital signal processor, a crypto processor, a chipset 812, an antenna 825, touchscreen display 815, touchscreen controller 865, battery 816, audio codec, video codec, power amplifier 821, global positioning system (GPS) device 840, compass 845, accelerometer, gyroscope, speaker 820, camera 841, and mass storage device (such as hard disk drive, solid-state drive (SSD), compact disk (CD), digital versatile disk (DVD), and so forth), or the like. In some exemplary embodiments, at least one of the functional blocks noted above comprise an IC package assembly including active package cooling structures within a molded packaging substrate, for example as described elsewhere herein.

Communication chips 806 may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 806 may implement any of a number of wireless standards or protocols, including but not limited to those described elsewhere herein. As discussed, computing device 800 may include a plurality of communication chips 806. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

Figure 9:
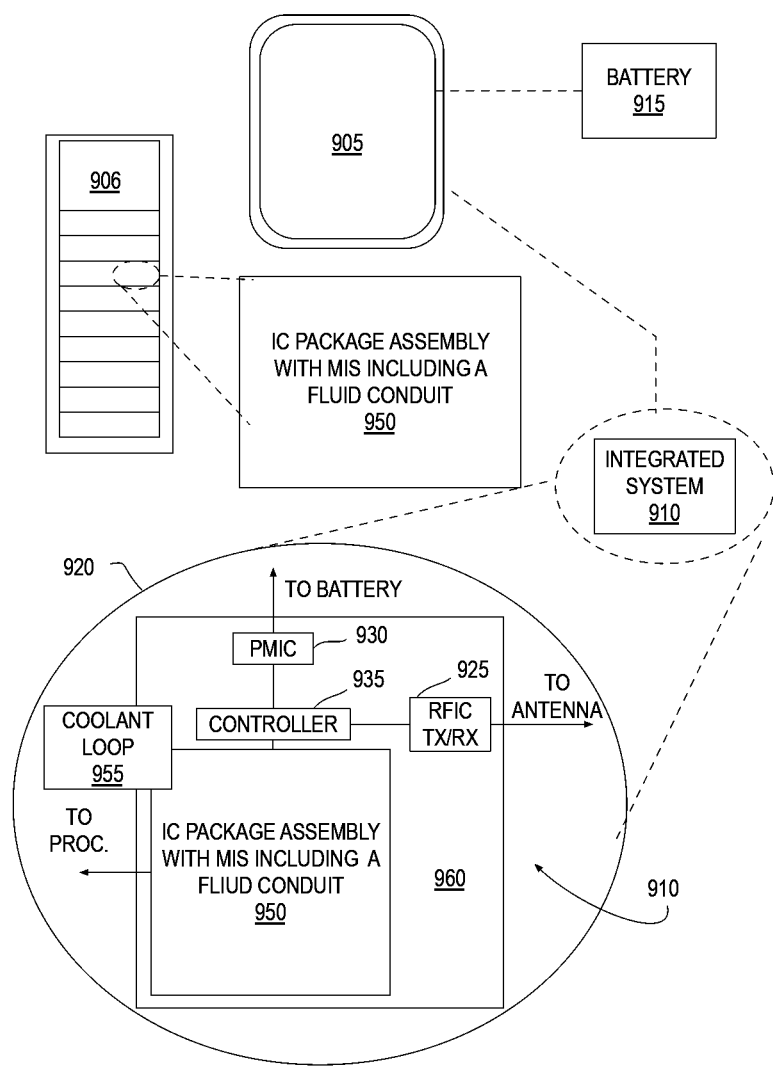
FIG. 9 illustrates a mobile computing platform and a data server machine employing an IC assembly including a molded substrate with a fluid conduit suitable for active cooling, in accordance with some embodiments.

FIG. 9 illustrates a mobile computing platform and a data server machine employing a IC package assembly including active package cooling structures within a molded packaging substrate, for example as described elsewhere herein. Computing device 800 may be found inside platform 905 or server machine 906, for example. The server machine 906 may be any commercial server, for example including any number of high-performance computing platforms disposed within a rack and networked together for electronic data processing, which in the exemplary embodiment includes a package assembly 950 including active package cooling structures within a molded packaging substrate, for example as described elsewhere herein. The mobile computing platform 905 may be any portable device configured for each of electronic data display, electronic data processing, wireless electronic data transmission, or the like. For example, the mobile computing platform 905 may be any of a tablet, a smart phone, laptop computer, etc., and may include a display screen (e.g., a capacitive, inductive, resistive, or optical touchscreen), a chip-level or package-level integrated system 910, and a battery 915.

Whether disposed within the integrated system 910 illustrated in the expanded view 920, or as a stand-alone chip within the server machine 906, IC package assembly 950 may include active package cooling structures within a molded packaging substrate, for example as described elsewhere herein. Assembly 950 may be further coupled to a board, a substrate, or an interposer 960 along with, one or more of a power management integrated circuit (PMIC) 930, RF (wireless) integrated circuit (RFIC) 925 including a wideband RF (wireless) transmitter and/or receiver (TX/RX) (e.g., including a digital baseband and an analog front end module further comprises a power amplifier on a transmit path and a low noise amplifier on a receive path), and a controller 935. A coolant loop 955, for example including a heat exchanger and a recirculation system is implemented at a system board level or platform-level (off-board). Coolant loop 955 may be coupled into IC package assembly 950, for example.

Functionally, PMIC 930 may perform battery power regulation, DC-to-DC conversion, etc., and so has an input coupled to battery 915 and with an output providing a current supply to other functional modules. As further illustrated, in the exemplary embodiment, RFIC 925 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G, and beyond.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In first examples, a microelectronic device package assembly comprises a substrate structure comprising one or more traces adjacent to a mold material, wherein the traces comprises a metal. The assembly comprises an integrated circuit (IC) die physically coupled to the substrate structure, and electrically coupled to at least one of the traces, and a fluid conduit within the substrate structure, wherein at least a portion of the fluid conduit comprises the metal.

In second examples, for any of the first examples the fluid conduit comprises an inlet to receive a fluid into the substrate structure and an outlet to discharge the fluid from the substrate structure with a length of the conduit therebetween.

In third examples, for any of the second examples the die is over at least a portion of the fluid conduit, and wherein the length of the fluid conduit is greater than a length of the die.

In fourth examples, for any of the first through the third examples, the substrate structure comprises a first and second substrate, the first substrate bonded to the second substrate by a plurality of solder features, and wherein the fluid conduit is between the first and second substrate.

In fifth examples, for any of the first examples the die is bonded to the first substrate, the fluid conduit comprises an inlet to receive a fluid into the substrate structure and an outlet to discharge the fluid from the substrate structure, and the fluid conduit comprises a metal trace of the first substrate attached by solder to a metal trace of the second substrate.

In sixth examples, for any of the first through the fifth examples the fluid conduit comprises a lateral run between a first conductive via structure and a second conductive via structure, and the first conductive via structure is to convey the fluid to the lateral run, and the second conductive via structure is to covey the fluid from the lateral run.

In seventh examples, for any of the first through the sixth examples the fluid conduit further comprises solder, the solder bonded to the metal.

In eighth examples, for any of the first through seventh examples the fluid conduit comprises a heat pipe sealed within the substrate structure.

In ninth examples, a microelectronic assembly comprises the package structure of any of the first through eighth examples, and the fluid conduit comprises a first conduit having a sidewall comprising a first trace and a second conduit having a sidewall comprising a second trace.

In tenth examples, for any of the ninth examples the first and second conduits are separated from each other by the first and second traces, and the IC die is electrically coupled to a conductive interconnect located between the first and second conductive traces.

In eleventh examples, for any of the ninth through tenth examples each of a first sidewall, a second sidewall, a top side, and a bottom side of the channel comprises a conductive trace.

In twelfth examples, for any of the eleventh examples at least one of the first sidewall, the second sidewall, the top side or the bottom side of the channel is adjacent the mold material.

In thirteenth examples for any of the ninth through twelfth examples, the substrate structure comprises a first mold material; the IC die is embedded within a second mold material, the IC die is coupled to the substrate structure through solder features, and the fluid conduit is separated from the IC die by at least the first mold material.

In fourteenth examples, for any of the ninth through thirteenth examples, at least one of the first sidewall or the second sidewall comprises one or more of copper or solder.

In fifteenth examples, for any of the ninth through fourteenth examples the channel comprises a through-substrate via structure, and wherein a sidewall of the through-substrate via structure comprises a first interconnect trace level of the substrate structure and a second interconnect trace level of the substrate structure, in contact with the first interconnect trace level.

In sixteenth examples, a method of fabricating a microelectronic package assembly comprises forming a fluid conduit within a package substrate structure, the fluid conduit at least partially defined by an interconnect trace comprising a metal, the trace adjacent to a first mold compound, and the fluid conduit extends a length of the substrate. The method further comprises affixing an integrated circuit (IC) die to a surface the package substrate structure, the IC die over the fluid conduit. The method further comprises forming a second mold compound around the IC die, wherein at least one of the first and second mold compounds separates the IC die from the fluid conduit.

In seventeenth examples, for any of the sixteenth examples forming the fluid conduit comprises affixing a first substrate to a second substrate by soldering an interconnect trace of the first substrate to an interconnect trace of the second substrate, wherein the interconnect trace of the first substrate is adjacent to a first mold compound, and the interconnect trace of the second substrate is adjacent to a second mold compound.

In eighteenth examples, for any of the sixteenth through seventeenth examples, forming the fluid conduit comprises one of forming a vertical channel through at least a partial thickness of the substrate structure by laser drilling through the mold compound.

In nineteenth examples, for any of the sixteenth through eighteenth examples forming the fluid conduit comprises removing, selectively to the mold compound, a sacrificial material from one side of the interconnect trace.

In twentieth examples, for any of the sixteenth through nineteenth examples, the method further comprises coupling a fluid supply to a first end of the fluid conduit, and coupling a fluid return to a second end of the fluid conduit.

What is claimed is:

1. A microelectronic device package structure, comprising:
 a substrate structure comprising one or more traces adjacent to a mold material, wherein the traces comprise a metal;
 an integrated circuit (IC) die physically coupled to the substrate structure, and electrically coupled to at least one of the traces; and
 a fluid conduit within the substrate structure, wherein at least a portion of the fluid conduit comprises the metal, and wherein the fluid conduit comprises an inlet to receive a fluid into the substrate structure and an outlet to discharge the fluid from the substrate structure with a length of the fluid conduit therebetween.

2. The microelectronic device package structure of claim 1, wherein the IC die is over at least a portion of the fluid conduit, and wherein the length of the fluid conduit is greater than a length of the IC die.

3. The microelectronic device package structure of claim 1, wherein the fluid conduit comprises a lateral run between a first conductive via structure and a second conductive via structure, and wherein the first conductive via structure is to convey the fluid to the lateral run, and the second conductive via structure is to convey the fluid from the lateral run.

4. A microelectronic device package structure, comprising:
 a substrate structure comprising one or more traces adjacent to a mold material, wherein the traces comprise a metal;
 an integrated circuit (IC) die physically coupled to the substrate structure, and electrically coupled to at least one of the traces; and
 a fluid conduit within the substrate structure, wherein at least a portion of the fluid conduit comprises the metal, and wherein the fluid conduit comprises a heat pipe sealed within the substrate structure.

5. A microelectronic device package structure, comprising:
 a substrate structure comprising one or more traces adjacent to a mold material, wherein the traces comprise a metal;
 an integrated circuit (IC) die physically coupled to the substrate structure, and electrically coupled to at least one of the traces; and
 a fluid conduit within the substrate structure, wherein at least a portion of the fluid conduit comprises the metal, and wherein the substrate structure comprises a first substrate and a second substrate, the first substrate bonded to the second substrate, and wherein the fluid conduit is between the first substrate and the second substrate.

6. The microelectronic device package structure of claim 5, wherein:
 the IC die is bonded to the first substrate; and
 the fluid conduit comprises a metal trace of the first substrate directly bonded, or attached by solder, to a metal trace of the second substrate.

7. The microelectronic device package structure of claim 5, wherein the fluid conduit further comprises solder bonded to the metal.

8. The microelectronic device package structure of claim 5, wherein the fluid conduit comprises a first conduit having a sidewall comprising a first trace and a second conduit having a sidewall comprising a second trace.

9. The microelectronic device package structure of claim 8, wherein the first and second conduits are separated from each other by the first and second traces, and wherein the IC die is electrically coupled to a conductive interconnect located between the first trace and the second trace.

10. The microelectronic device package structure of claim 8, wherein each of a first sidewall, a second sidewall, a top side and a bottom side of the fluid conduit comprises a conductive trace.

11. The microelectronic device package structure of claim 10, wherein at least one of the first sidewall, the second sidewall, the top side or the bottom side of the fluid conduit is adjacent the mold material.

12. The microelectronic device package structure of claim 10, wherein:
 the substrate structure comprises a first mold material;
 the IC die is embedded within a second mold material;
 the IC die is coupled to the substrate structure through solder features; and
 the fluid conduit is separated from the IC die by at least the first mold material.

13. The microelectronic device package structure of claim 10, wherein at least one of the first sidewall or the second sidewall comprises one or more of copper or solder.

14. The microelectronic device package structure of claim 8, wherein the fluid conduit comprises a through-substrate via structure, and wherein a sidewall of the through-substrate via structure comprises a first interconnect trace level of the substrate structure and a second interconnect trace level of the substrate structure, in contact with the first interconnect trace level.

* * * * *